PRESSURE CONTACT SEMICONDUCTOR DEVICES

Filed Nov. 29, 1967

United States Patent Office 3,513,359

Patented May 19, 1970

3,513,359

PRESSURE CONTACT SEMICONDUCTOR DEVICES

Colin Bright Lewis, Nettleham, England, assignor to Associated Electrical Industries Limited, London, England, a British company

Filed Nov. 29, 1967, Ser. No. 686,483
Claims priority, application Great Britain, Dec. 2, 1966, 54,137/66
Int. Cl. H01l *1/14, 5/02*
U.S. Cl. 317—234 11 Claims

ABSTRACT OF THE DISCLOSURE

A semiconductor device in which electrical connection to a wafer of semiconductor material is provided by pressure contact on a pair of electrodes, one of which is a backing plate on which the wafer is mounted and the other is a surface electrode on the opposite face of the wafer, the surface electrode being constituted by a layer of conductive material applied to the surface of a diffused region of the wafer.

Background of the invention

This invention relates to semiconductor devices in which electrical connection to a wafer of semiconductor material, having at least one rectifying or otherwise asymmetrically acting junction therein, is provided by a pair of conductive members urged into pressure contact with a pair of electrodes one on each of the opposite faces of the wafer. The pressure is usually provided by a spring arrangement included in the device assembly.

It is well known that most semiconductor materials are brittle and to strengthen a thin wafer of semiconductor material for use in a device it is convenient to mount the wafer by alloying one face of it to a face of a backing plate of an electrically conductive material which has the same, or substantially the same, co-efficient of expansion as the semiconductor material. When the semiconductor material is silicon it is convenient for the backing plate to be of molybdenum or tungsten. The backing plate serves as the electrode on the face of the wafer to which it is secured and a surface electrode is provided on the opposite face of the wafer. This surface electrode is usually provided by partially alloying a gold foil into the semiconductor material over a central portion of the face of the wafer.

During the alloying process in which the wafer is mounted on the backing plate to form an element it is found that the backing plate frequently warps so that its outer face is of concave form. When the electrical connection between the outer face of the backing plate and the corresponding conductive member is a soldered connection the warping of the backing plate presents no difficulty since the solder fills up the hollow between the backing plate and the conductive member; but when the electrical connection between the outer face of the backing plate and the corresponding conductive member is purely a pressure contact then it is necessary to flatten the outer surface of the backing plate so that efficient electrical and thermal contact is made between the backing plate and the conductive member.

It is known to machine and then lap the outer face of the backing plate to flatten it but this involves several mechanical operations and consequently increases the cost of manufacturing the semiconductor devices. If the pressure applied to the element by the contacts is made sufficiently high the backing plate is flattened but the opposite face of the semiconductor wafer is also flattened and this results in the electrode which is alloyed into that face of the wafer being put under radial compression and, at least in the case of an alloyed-in gold electrode which is relatively hard and unyielding, failure of the semiconductor element may arise due to mechanical failure at the surface edges of the junction between the inset region and the adjacent region of the semiconductor wafer.

It is an object of the present invention to provide a semiconductor device in which the risk of such failure is minimised.

Summary of the invention

According to the present invention, in such a semiconductor device the or each junction is a diffused junction and the surface electrode, instead of being alloyed into a region of the wafer below the surface, is constituted by a layer of conductive material applied in non-alloying manner to the surface of a diffused electrode region of the wafer.

The surface electrode may be provided by plating the outer surface of said diffused region with conductive material or by evaporating such material on to that surface.

Since the surface electrode is applied to the surface of the wafer and is not alloyed into a region of the wafer below the surface a hard, unyielding region in the wafer is not produced and the element (i.e. the wafer and its electrodes) is more flexible so that, when pressure is applied to the element to flatten it, there is little or no stress in the semiconductor wafer.

Brief description of the drawing

In order that the invention may be more readily understood it will now be described, by way of example, with reference to the accompanying drawing in which.

Description of the prior art

Figure 1:
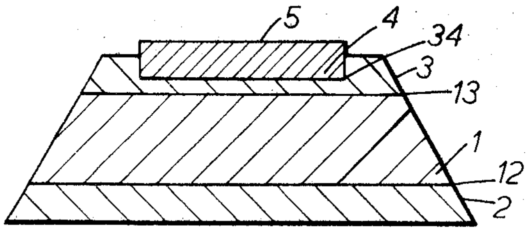
FIG. 1 is a sectional side elevation of an alloy/diffused wafer of semiconductor material for use in a thyristor.

Referring to FIG. 1 a wafer of silicon semiconductor material for an alloy/diffused thyristor has a region 1 of n-type conductivity separated from a region 2 of p-type conductivity by a p-n punction 12 and from a further region 3 of p-type conductivity by a p-n junction 13. Regions 2 and 3 are formed by diffusion techniques in which gallium is diffused into the n-type silicon. A region 4 of gold alloyed into the region 3 is of n-type conductivity and is separated from the region 3 by a p-n junction 34. The region 4 has a part 5 which remains proud of the upper surface of the wafer and serves as an electrode.

Figure 2:
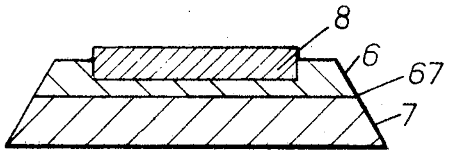
FIG. 2 is a sectional side elevation of an alloy/diffused wafer of semiconductor material for use in a rectifier.

Referring to FIG. 2 a wafer of silicon semiconductor material for an alloy/diffused rectifier has a region 6 of n-type conductivity separated from a gallium-diffused region 7 of p-type conductivity by a p-n junction 67. An electrode 8 is formed by alloying gold into the upper surface of the n-type region 6. The electrode projects proud of the upper surface of region 6.

Figure 3:
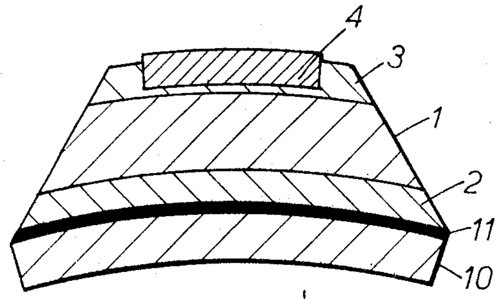
FIG. 3 is a sectional side elevation of a thyristor element comprising the wafer shown in FIG. 1 mounted on a backing plate.
Figure 4:
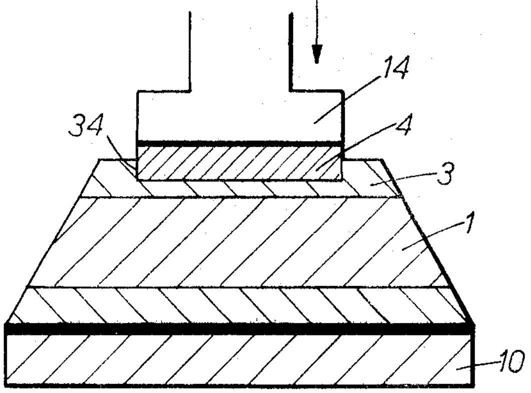
FIG. 4 is a thyristor element which is flattened by having pressure applied thereto.

If either of the wafers of semiconductor material shown in FIGS. 1 and 2 is mounted on a backing plate of say molybdenum or tungsten by an alloying process it is likely that the backing plate will warp during the process. FIG. 3 shows the wafer of FIG. 1 mounted on a backing plate 10 by an alloyed layer 11 conveniently of aluminum to form an element suitable for use in a thyristor. However, during the alloying process the backing plate 10 is warped stressing the semiconductor wafer particularly on its upper surface. Pressure may be applied between the opposite outer surfaces of the element as indicated by the arrow in FIG. 4 to flatten the element. The pressure is applied by a conductive member 14 which engages the part 5 of the alloyed region 4 and sufficient force is applied to the element to flatten it. This flattening process causes the hard surface of the alloyed material forming the region 4 to be put into considerable radial compression which may bring about mechanical failure at the edges of the junction 34.

Description of the preferred embodiments

Figure 5:
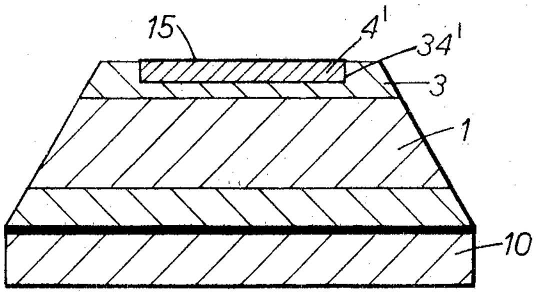
FIG. 5 is a sectional side elevation of a fully diffused thyristor element in accordance with the invention.

Referring now to FIG. 5, in accordance with the present invention a junction 34', in a thyristor wafer generally similar to that shown in FIG. 1, separates region 3 from a region 4' which is formed in the wafer by a diffusion process; for example, where the basic material of the wafer is n-type silicon (which constitutes region 1) and region 3 is formed by diffusion of gallium into it to change the conductivity-type to p-type, region 4' may be formed by diffusion of phosphorus into region 3 to change its conductivity-type locally to n-type. A fully diffused rectifier element would be formed in a similar manner but with the upper p-type region 3, resulting from the gallium diffusion, lapped off prior to diffusion of phosphorus into the n-type region 1 to form an $n^+$ electrode region similar to the n-type electrode region 4' shown in FIG. 5.

The upper surface of the region 4' is flush with the surface of the wafer and a layer 15 of suitable conductive material is deposited on the surface of the region 4' to serve as a surface electrode thereto. The layer 15 is preferably a double layer consisting of a layer of nickel followed by a layer of gold, which can be deposited by plating or evaporation techniques. Such a plated or evaporated layer does not produce a hard surface as does the alloyed-in region of the known arrangements and, by mounting the element between conductive members with sufficient contact pressure on it, the element can be substantially flattened without setting up dangerous stresses in the vicinity of the region 4' and the layer 15. As contact pressure is relied upon to flatten the element, lapping operations to flatten the outer surfaces of the element are not required.

I claim:

1. A semiconductor device comprising:

(a) a wafer of semiconductor material having two opposite faces and including a diffused electrode region having a surface constituting at least a portion of a first of said faces, the wafer having at least one rectifying or other asymmetrically acting diffused junction therein between said diffused region and another region having a surface constituting the second face, (b) a backing plate having two opposite faces and being composed of a conductive material with substantially the same coefficient of expansion as the semiconductor material, the wafer being mounted on the backing plate with the second face of the wafer facing a first of the faces of the backing plate, (c) a surface electrode constituted by a layer of conductive material applied to the surface of said diffused electrode region of the wafer, and (d) a pair of conductive members urged into pressure contact respectively with the surface electrode and with substantially the whole area of the second, outer, face of the backing plate, whereby the contact between the backing plate and the conductive member in contact therewith over substantially the whole outer face of the backing plate, being achieved by virtue of the contact pressure and involving flattening of the backing plate if warped, is so achieved without the imposition of injurious stresses in the wafer in the vicinity of the surface electrode.

2. A semiconductor device according to claim 1, in which the surface of the diffused electrode region is plated with the conductive material.

3. A semiconductor device according to claim 1, in which the surface of the diffused electrode region has the conductive material evaporated on to it.

4. A semiconductor device according to claim 1, in which the diffused electrode region is of the same conductivity type as an adjacent region of the wafer.

5. A semiconductor device according to claim 4, the wafer being of silicon semiconductor material, in which the diffused electrode region has phosphorus diffused into n-type silicon.

6. A semiconductor device according to claim 5, in which said layer is a double layer consisting of a layer of nickel and an outer layer of gold.

7. A semiconductor device according to claim 1, in which the diffused electrode region is of opposite conductivity type to an adjacent region of the wafer.

8. A semiconductor device according to claim 7, in which the diffused electrode region has phosphorus diffused into p-type gallium-diffused silicon.

9. A semi-conductor device according to claim 8, in which said layer is a double layer consisting of a layer of nickel and an outer layer of gold.

10. A semiconductor junction rectifier comprising:

(a) a wafer of basically n-type silicon semiconductor material having two opposite faces and comprising a main n-type region, a phosphorus-diffused $n^+$ electrode region having an outer surface constituting a central part of a first of said faces, and a gallium-diffused p-type region having an outer surface constituting the second of said faces and forming a p-n junction with the n-type region, (b) a backing plate having two opposite faces and being composed of a conductive material with substantially the same coefficient of expansion as the semiconductor material, the wafer being mounted on the backing plate with the second face of the wafer facing a first of the faces of the backing plate, (c) a surface electrode constituted by a double layer of conductive material applied to the outer surface of said electrode region and consisting of a layer of nickel and an outer layer of gold, and (d) a pair of conductive members urged into pressure contact respectively with the surface electrode and with substantially the whole area of the second, outer, face of the backing plate, whereby the contact between the backing plate and the conductive member in contact therewith over substantially the whole outer face of the backing plate, being achieved by virtue of the contact pressure and involving flattening of the backing plate if warped, is so achieved without the imposition of injurious stresses in the wafer in the vicinity of the surface electrode.

11. A thyristor comprising:

(a) a wafer of basically n-type silicon semiconductor material having two opposite faces and comprising a main n-type region, a first gallium-diffused p-type region forming a p-n junction with the main n-type region at one internal face of each, a phosphorus-diffused n-type electrode region forming a p-n junction with the first gallium-diffused region at an opposite internal face of the latter and having an outer surface constituting a central part of a first of said faces of the wafer, and a second gallium-diffused p-type region having an outer surface constituting the second face of the wafer and forming another p-n junction with the main n-type region at an opposite internal face of the latter, (b) a backing plate having two opposite faces and being composed of a conductive material with substantially the same coefficient of expansion as the semiconductor material, the wafer being mounted on the backing plate with the second face of the wafer facing a first of the faces of the backing plate, (c) a surface electrode constituted by a double layer of conductive material applied to the outer surface of said electrode region and consisting of a layer of nickel and an outer layer of gold, and (d) a pair of conductive members urged into pressure contact respectively with the surface electrode and with substantially the whole area of the second, outer, face of the backing plate, whereby the contact between the backing plate and the conductive member in contact therewith over substantially the whole outer face of the backing plate, being achieved by virtue of the contact pressure and involving flattening of the backing plate if warped, is so achieved without the imposition of injurious stresses in the wafer in the vicinity of the surface electrode.

References Cited

UNITED STATES PATENTS

| | | | |
|---|---|---|---|
| 3,274,460 | 9/1966 | Pessok | 317—235 |
| 3,337,781 | 8/1967 | Ferree | 317—234 |
| 3,415,943 | 12/1968 | Meyeroff | 174—52 |

FOREIGN PATENTS

| | | |
|---|---|---|
| 1,030,669 | 5/1966 | Great Britain. |

JOHN W. HUCKERT, Primary Examiner

R. F. POLISSACK, Assistant Examiner

U.S. Cl. X.R.

317—235